US 6,652,824 B2

(12) United States Patent
Nettleton et al.

(10) Patent No.: US 6,652,824 B2
(45) Date of Patent: Nov. 25, 2003

(54) METHOD OF GROWING LARGE-DIAMETER DISLOCATION-FREE <110> CRYSTALLINE INGOTS

(75) Inventors: Rosemary T. Nettleton, Vancouver, WA (US); Robert L. Faulconer, Brush Prairie, WA (US); Aaron W. Johnson, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 10/314,719

(22) Filed: Dec. 9, 2002

(65) Prior Publication Data

US 2003/0097975 A1 May 29, 2003

Related U.S. Application Data

(62) Division of application No. 09/778,373, filed on Feb. 7, 2001, now Pat. No. 6,514,337.

(51) Int. Cl.$^7$ ................................. C01B 33/26
(52) U.S. Cl. ................. 423/328.2; 117/13; 117/19
(58) Field of Search ................. 117/13, 19; 423/328.2

(56) References Cited

U.S. PATENT DOCUMENTS

| | | |
|---|---|---|
| 4,722,764 A | 2/1988 | Herzer et al. |
| 5,183,528 A | 2/1993 | Baba et al. |
| 5,578,284 A | 11/1996 | Chandrasekhar et al. |
| 5,628,823 A | 5/1997 | Chandrasekhar et al. |
| 5,779,791 A | 7/1998 | Korb et al. |
| 5,919,303 A | 7/1999 | Holder |
| 6,090,198 A | 7/2000 | Aydelott |
| 6,228,165 B1 | 5/2001 | Baba et al. |

FOREIGN PATENT DOCUMENTS

EP    0 795 632 A1    9/1997
EP    0 821 083 A1    1/1998

OTHER PUBLICATIONS

Takao Abe, *Innovated Silicon Crystal Growth and Wafering Technologies*, Electrochemical Society Proceedings, vol. 97–3, May 5–9, 1997, pp. 123–133.

V. V. Antonova et al., *Origin of Dislocation Subboundaries in NaCl Single Crystals Grown From the Melt*, Soviet Physics Solid State, vol. 10, No. 11, May 1969, pp. 2599–2602.

Lawrence D. Dyer, *Dislocation–Free Czochralski Growth of <110> Silicon Crystals*, Journal of Crystal Growth 47 (1979) pp. 533–540.

Shun–Ichi Tohno et al., *X–ray topographic observation of dislocation generation and propagation in InP single crystal grown by the liquid–encapsuled Czochralski technique*, J. Appl. Phys. 54 (2), Feb. 1983, pp. 666–672.

(List continued on next page.)

Primary Examiner—Felisa Hiteshew
(74) Attorney, Agent, or Firm—Alston & Bird LLP

(57) ABSTRACT

A method of growing a crystalline ingot having a <110> orientation, such as a dislocation-free ("DF") crystalline ingot, is provided. The method of manufacture includes providing a liquidous melt. Next, a seed crystal having a <110> crystal direction is contacted with the surface of the melt. The seed crystal is then withdrawn from the melt to thereby grow a neck. According to one embodiment, the seed elevation rate is automatically modified during the withdrawing step to reduce the diameter of the neck to greater than about 2.5 mm. Thereafter, the seed elevation rate is manually modified to alternate the diameter of the neck between about 2 mm and about 2.5 mm to thereby shape the neck into a recurring hourglass configuration. The neck is then withdrawn from the melt to grow a crystalline ingot having a <110> crystal direction and a diameter of at least about 200 mm.

18 Claims, 10 Drawing Sheets

OTHER PUBLICATIONS

Susumu Kondo et al., *Low Dislocation Density GaSb Single Crystals Grown by LEC Technique*, Journal of Crystal Growth 56 (1982), pp. 39–44.

B. Cockayne et al., *Control of Dislocation Structures in LEC Single Crystal InP*, Journal of Crystal Growth 64 (1983), pp. 48–54.

G. Fraundorf et al., *The Effects of Thermal History During Growth on O Precipitation in Czochralski Silicon*, J. Electrochem. Soc.: Solid–State Science and Technology, Jul. 1985, pp. 1701–1704.

K. Yamada et al., *Elimination of Grown–In Dislocations in In–Doped Liquid Encapsulated Czochralski GaAs*, Journal of Crystal Growth 78 (1986), pp. 36–42.

H. Kuwamoto et al., *Dislocation Reduction in Large–Diameter LEC GaAs Growth*, Journal of Crystal Growth 91 (1988), pp. 567–575.

L.A. Prokhorov et al., *Inheritance of seed dislocations by a single crystal*, Sov. Phys. Crystallogr. 34(5), Sep.–Oct. 1989, pp. 758–759.

Herng–Der Chiou et al., *The Stress and Strength at the Neck of a Large Diameter Silicon Crystal during Growth*, J. Electrochem. Soc., vol. 144, No. 8, Aug. 1997, pp. 2881–2886.

S. Miyahara et al., *Global Heat Transfer Model for Czochralski Crystal Growth Based on Diffuse–Gray Radiation*, Journal of Crystal Growth 99 (1990) pp. 696–701.

METHOD OF GROWING LARGE-DIAMETER DISLOCATION-FREE <110> CRYSTALLINE INGOTS

CROSS REFERENCE TO RELATED APPLICATIONS

This application is a divisional of U.S. application Ser. No. 09/778,373, filed Feb. 7, 2001, now U.S. Pat. No. 6,514,332 which is hereby incorporated herein in its entirety by reference.

FIELD OF THE INVENTION

The present invention relates generally to a method of growing crystalline ingots and, more particularly, to a method of growing large-diameter, substantially dislocation-free crystalline ingots having a <110> crystal direction.

BACKGROUND OF THE INVENTION

The monocrystalline silicon that is the starting material for many semiconductor electronic components is commonly prepared by a Czochralski ("CZ") process. In this process, pieces of polycrystalline silicon are placed in a crucible and melted to a liquidous state, thereby creating a melt. A seed crystal having the desired monocrystalline atomic structure is then lowered into contact with the molten silicon. As the seed crystal is slowly extracted from the melt, a monocrystalline ingot is drawn from the melt having the same atomic structure as the seed crystal.

Unfortunately, dislocation defects are generated in the seed crystal due to the thermal shock created as the seed crystal contacts the melt. Unless corrective actions are taken, the dislocation defects can propagate through and multiply in the growing crystal. As known to those skilled in the art, dislocations generally propagate along crystallographic planes. For a silicon seed crystal having a <100> crystal direction, the dislocations typically propagate along a plane that extends at an angle of 55° from the longitudinal axis of the crystal. For a silicon seed crystal having a <110> crystal direction, the dislocations typically propagate along a plane that extends at an angle of 54.74° from the longitudinal axis of the crystal or propagate along the growth axis itself.

In order to terminate the dislocations prior to propagation through the main body of the crystalline ingot, crystals are typically grown with a neck section extending between the seed crystal and the main body of the crystal. The most common method of eliminating dislocations is known as the Dash method and involves growing a neck having a relatively small diameter and a relatively long length. For example, for a crystalline ingot having a <100> crystal direction, a neck grown according to the Dash method may have a diameter of between 2 mm and 4 mm and a length between 30 mm and 200 mm. As the neck is grown, the dislocations propagate through the neck toward the interface of the seed crystal and the melt. As a result of the extended length and small diameter of the neck, however, the dislocations terminate at the exterior surface of the neck such that the main body of the crystal is dislocation free ("DF"). The crystal is then expanded in diameter through the shoulder or cone portion to the DF main body. Since there is no easy and reliable method to determine if the dislocations have been terminated, the Dash method generally requires the neck to have a relatively small diameter and an extended length in order to effectively terminate most, if not all, dislocations.

Although the Dash method is widely utilized to grow large-diameter crystalline ingots having a <100> orientation, including ingots having diameters exceeding 200 mm, the growth of large-diameter DF crystalline ingots having a <110> orientation has been limited to ingots having a diameter of less than approximately 155 mm. Crystals having a <110> orientation are more difficult to grow than crystals having a <100> orientation because dislocations in <110> crystals can propagate along the growth axis, resulting in a crystal having no usable material. In addition, the thin neck grown according to the Dash method limits the crystal length and weight.

DF crystalline ingots having a <110> orientation are particularly desirous because such ingots have an improved wafer oxidation rate over crystalline ingots having a <100> orientation and an improved surface state density and Epi-pattern displacement over crystalline ingots having a <100> orientation. Thus, a need exists for an improved technique for growing large-diameter DF crystalline ingots having a <110> crystal direction and, in particular, a technique for growing DF crystalline ingots having a <110> crystal direction and a diameter of approximately 200 mm and larger.

SUMMARY OF THE INVENTION

The present invention provides a DF crystalline ingot having a <110> crystal direction and a diameter of at least about 200 mm and an associated method of manufacture. More specifically, the present invention provides a monocrystalline ingot formed of silicon in which the crystalline ingot has a <110> crystal direction and a diameter of at least about 200 mm. In one embodiment, the crystalline ingot is doped with phosphorous, arsenic, antimony, boron, aluminum, gallium, or indium. In another embodiment, the crystalline ingot includes a body portion and a neck extending therefrom. Advantageously, at least a portion of the neck adjacent to the body portion has a recurring hourglass configuration to thereby facilitate termination of dislocations within the neck. The portion of the neck defining the recurring hourglass configuration preferably has a diameter alternating between about 2 mm and about 2.5 mm.

The present invention also provides a method of manufacturing a DF crystalline ingot, including providing a liquidous melt. In one embodiment, a seed crystal having a <110> crystal direction and a length of about 100 mm to about 120 mm is provided. In another embodiment, a seed crystal having a <110> crystal direction and a width of about 15 mm is provided. Next, the seed crystal is contacted with the surface of the melt. In one embodiment, the seed crystal is positioned near the melt prior to the contacting step to thereby raise the temperature of the seed crystal. In another embodiment, the seed crystal is held in contact with the melt after the contacting step until the temperature of the seed crystal stabilizes. In still another embodiment, a portion of the seed crystal is inserted into the melt after the contacting step such that the inserted portion of the seed crystal melts. For example, in one embodiment, a portion of the seed crystal about 1 mm to about 10 mm in length is inserted into the melt.

The seed crystal is then withdrawn from the melt to thereby grow a neck. Thereafter, the neck is withdrawn from the melt to grow a crystalline ingot having a <110> crystal direction and a diameter of at least about 200 mm. In one embodiment, the seed elevation rate is automatically modified during the first withdrawing step to reduce the diameter of the neck to greater than about 2.5 mm. Thereafter, the seed elevation rate is manually modified to alternate the diameter of the neck between about 2 mm and about 2.5 mm to thereby shape the neck into a recurring hourglass configuration. Advantageously, the portion of the neck having the recurring hourglass configuration facilitates termination of dislocations within the neck such that the crystalline ingot grown during the second withdrawing step is substantially dislocation free. The crystalline ingot preferably includes a shoulder, main body, and an elongate tail portion. In one embodiment, the temperature of the melt is modified during the second withdrawing step to flatten the cone portion of the crystalline ingot.

In another embodiment of the present invention, the seed crystal is withdrawn from the melt to thereby grow a neck having a first portion and a second portion. The first portion of the neck has a diameter that tapers from the diameter of the seed crystal. The second portion of the neck has a diameter alternating between about 2 mm and about 2.5 mm and has a recurring hourglass configuration. Advantageously, substantially all dislocations are terminated within the second portion of the neck. In one embodiment, the seed elevation rate is automatically modified during the withdrawing step to form the first portion of the neck. Thereafter, the seed elevation rate is manually modified to form the second portion of the neck. The second portion of the neck is then withdrawn from the melt to grow a crystalline ingot having a <110> crystal direction and a diameter of at least about 200 mm.

Accordingly, there has been provided an improved technique for growing large-diameter DF crystalline ingots having a <110> crystal direction. Advantageously, the technique allows DF crystalline ingots having a <110> crystal direction and a diameter of at least about 200 mm to be grown.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
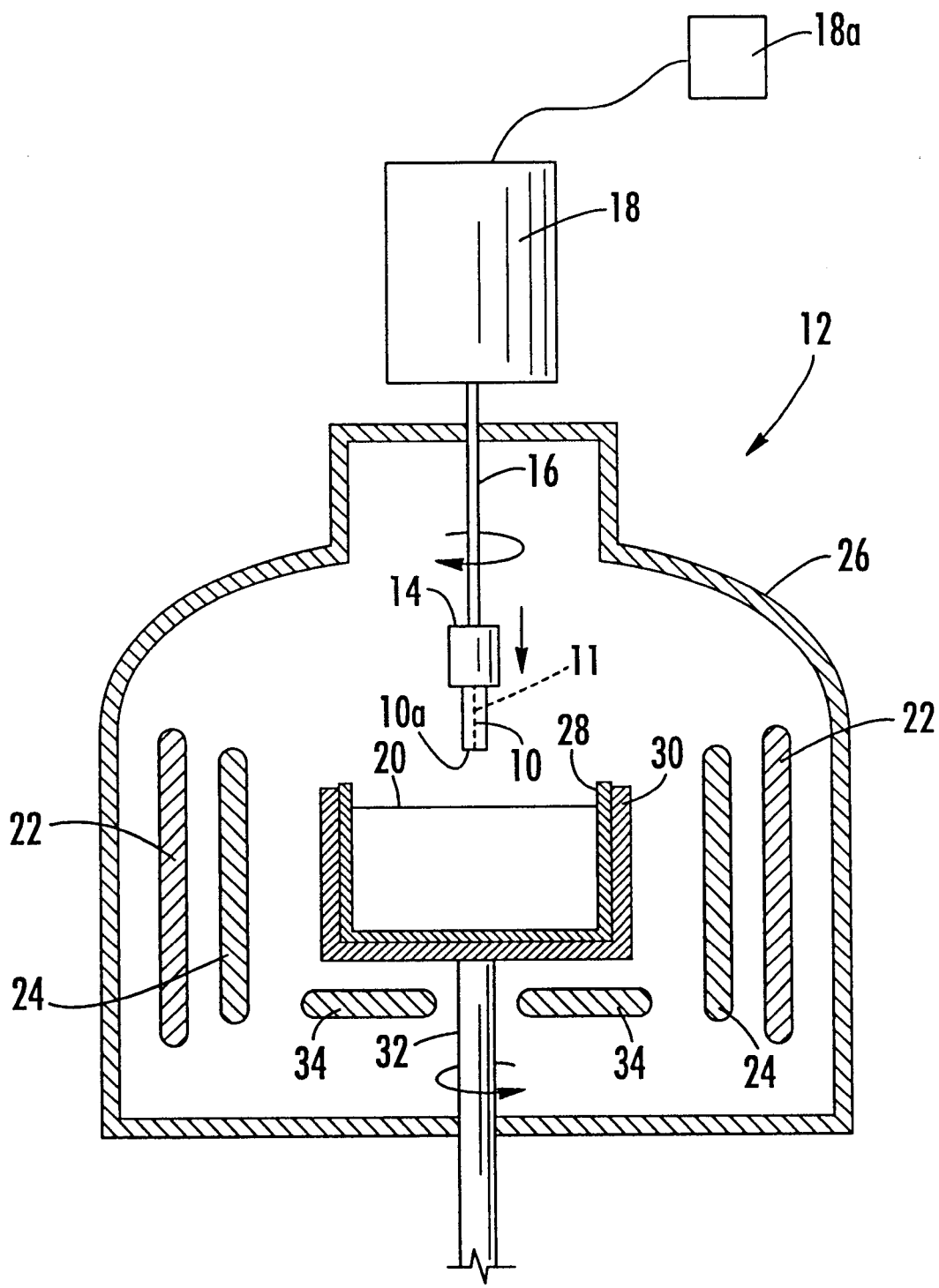
FIG. 1 is a schematic side view illustrating one embodiment of a CZ crystal growing apparatus that can implement the method of the present invention.

Referring to the drawings, and in particular to FIG. 1, there is illustrated a schematic of one embodiment of an apparatus 12 for growing crystalline ingots using the CZ method. During crystal growing operations, the seed crystal 10 is initially attached to a seed chuck 14 that securely holds the seed crystal throughout the growth process. For purposes of illustration and not limitation, a typical seed crystal can range from about 100 mm to about 120 mm in length, and more preferably about 110 mm in length, and have a cubic cross section of about 15 mm by about 15 mm. In order to grow a crystalline ingot having a <110> crystal direction, the seed crystal also has a <110> orientation. The seed chuck is connected to a rotatable cable or shaft 16 attached to a mechanism 18 for lowering and raising the seed crystal relative to a melt 20, such as a molten bath of silicon. Preferably, the lowering and raising mechanism 18 is in electrical and operable communication with a computing means 18a, such as a microprocessor, computer, or controller operating under software control. As known to those skilled in the art, the melt may include a predetermined percentage of dopant, if so desired, including phosphorous, arsenic, antimony, boron, aluminum, gallium, or indium. Among other components, the growing apparatus 12 typically includes a heat insulator 22 and a heater 24 disposed concentrically within a furnace body 26. A bottomed cylindrical quartz crucible 28 is typically received or nested within a graphite susceptor 30 that is fixed at the top end of a rotary shaft 32 that extends through the center of the furnace body. A second heater 34 may be positioned below the crucible and susceptor.

As illustrated in FIG. 1, the seed crystal 10 is secured within the seed chuck 14 and initially lowered to a position spaced from, but near the surface of the melt 20. As described in block 54 of FIG. 6a, the seed crystal 10 is held in this position near the surface of the melt 20 so that the seed crystal warms by thermal convection and radiation to a temperature near the temperature of the surface of the melt. Preferably, the seed crystal 10 and the melt 20 are rotated in opposite directions so that the seed crystal warms evenly. In one embodiment, the seed crystal 10 is held approximately 10 mm above the surface of the melt 20. However, the seed crystal 10 can be spaced by other distances from the melt 20 so long as the seed crystal is warmed to a temperature near the temperature of the surface of the melt without departing from the spirit and scope of the present invention.

In one embodiment, the crystal is grown using an "ECZ" technique developed by the assignee of the present application in which an electric potential is applied to the quartz crucible 28 filled with the silicon melt 20. Not intending to be limited or bound to any particular explanation or theory, it is believed that the electric potential uniformly devitrifies the inner layer of the quartz crucible 28 to a mostly B-cristobalite surface and that the uniform devitrification reduces the occurrence of localized small B-cristobalite formations. Since the B-cristobalite is more resistant to dissolution than amorphous quartz, the inner surface of the crucible 28 becomes more resistant to undercutting and releasing of small crystalline particles. Advantageously, without the presence of the crystalline particles, the likelihood of producing a dislocation-free crystal in the crucible 28 increases. See commonly owned U.S. patent application Ser. No. 09/362,103 now U.S. Pat. No 6,228,165 entitled "Method of Manufacturing Crystal of Silicon Using An Electric Potential" for a more detailed discussion of the ECZ technique.

Figure 2:
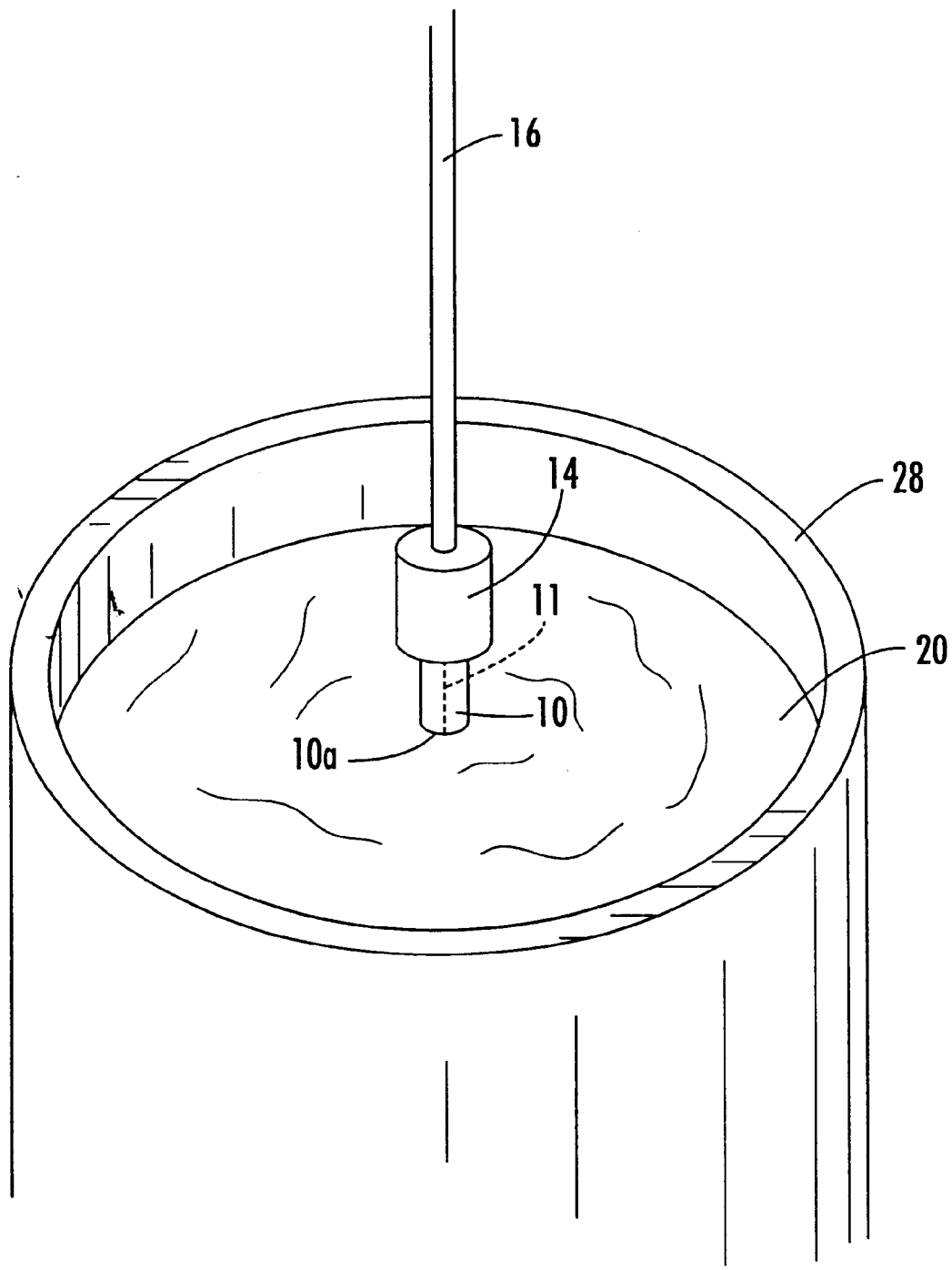
FIG. 2 is a side view illustrating the seed crystal being moved into contact with the melt.
Figure 3:
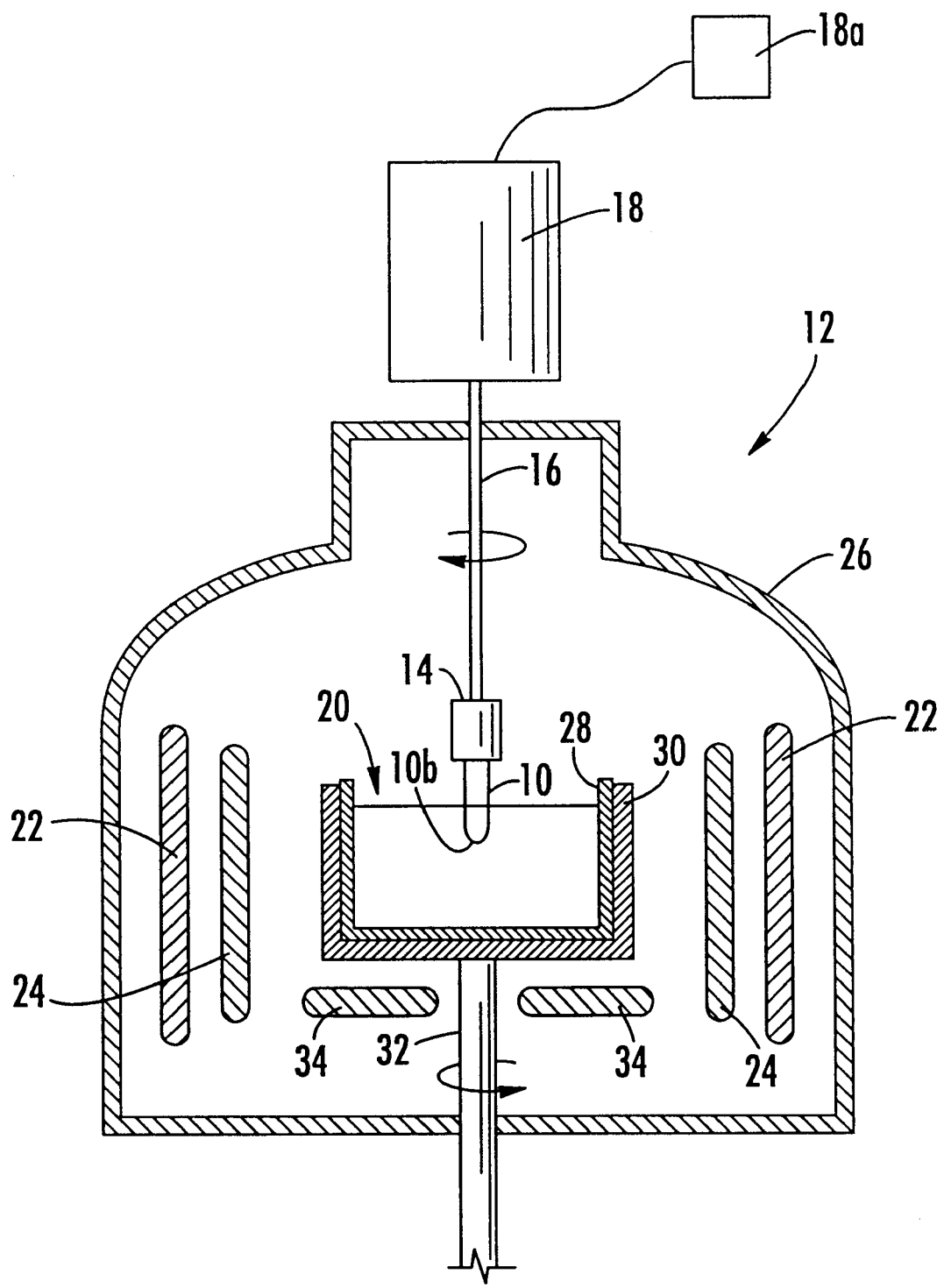
FIG. 3 is a schematic side view illustrating the seed crystal being inserted or dipped into the liquified melt.
Figure 6A:
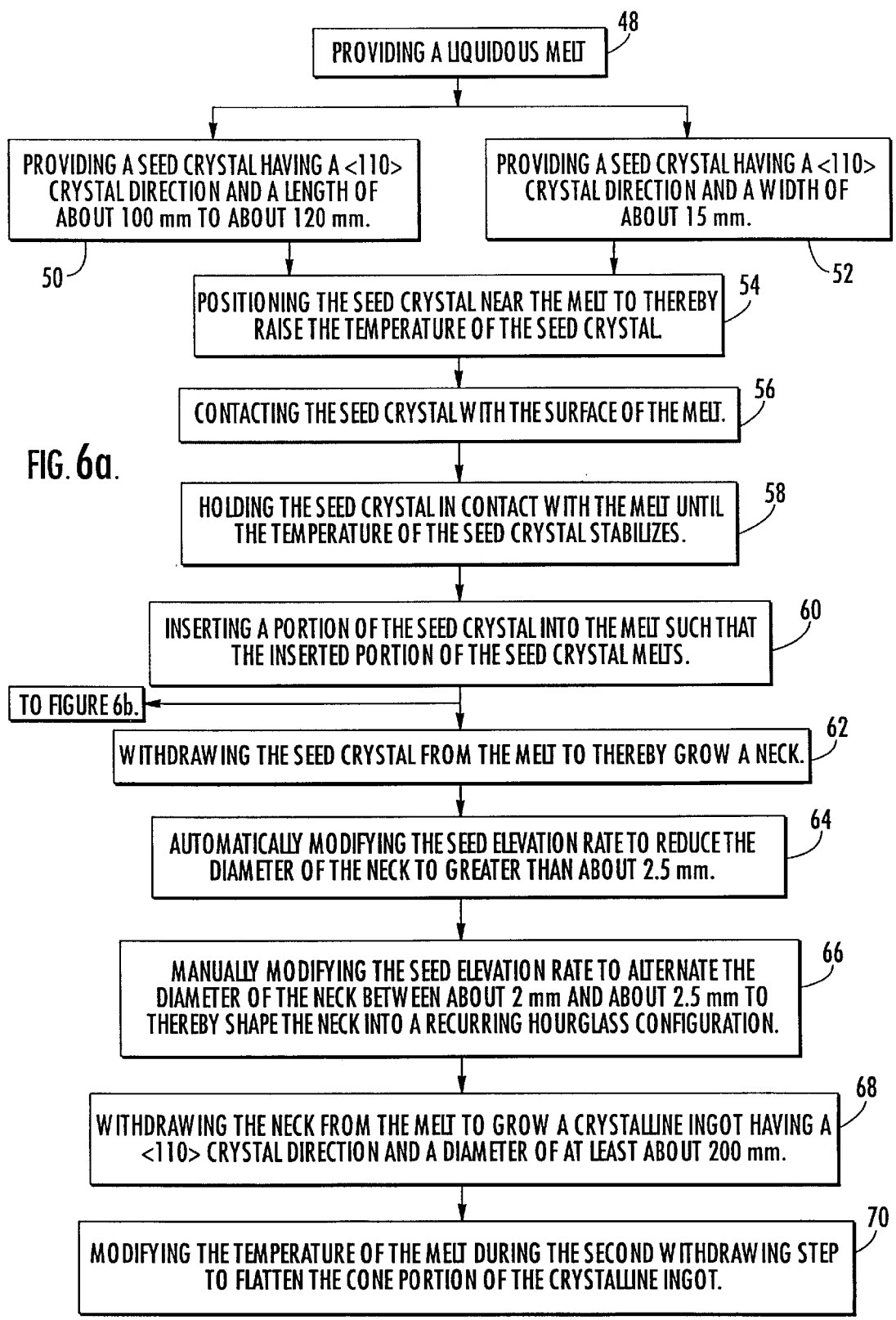
FIGS. 6a–6b are flow charts illustrating operations performed during fabrication of a DF crystalline ingot having a <110> orientation, according to two advantageous embodiments of the present invention.

As illustrated in FIG. 2 and as described in block 56 in FIG. 6a, once the seed crystal 10 reaches a stable temperature near the temperature of the surface of the melt 20, the seed crystal is again lowered such that the end 10a, i.e., the bottom surface, of the seed crystal contacts the surface of the melt. The time necessary for the elongate seed crystal 10 to stabilize is dependent upon a number of factors, for example, the size of the melt, the temperature of the melt, the cooling gas flow rate, the weight of the charge, the location of the heaters, as well as the pressure in the growing apparatus, which is normally maintained below ambient pressure. As illustrated in FIG. 3, the seed crystal 10 contacts the melt 20, heat transfer from the surface of the melt to the seed crystal changes from primarily convection to primarily conduction.

The thermal shock arising from the change in the heat transfer mechanism from convection to conduction results in dislocations being generated in the seed crystal 10. As known to those skilled in the art, a seed crystal 10 having a predetermined orientation or crystal direction defines one or more crystallographic planes along which the dislocations generally propagate. In particular, it is generally understood that the dislocations tend to propagate along the crystallographic plane of the seed crystal that is the most dense, although some dislocations may propagate along other crystallographic planes. For a monocrystalline silicon seed crystal having a <110> orientation, the dislocations generally propagate along the {111} plane, which is disposed at an angle of approximately 54.74° relative to the longitudinal axis 11 defined by the seed crystal 10, or parallel to the {110} plane itself, which comprises the growth axis.

As described in block 58 of FIG. 6a, the seed crystal 10 is held in contact with the surface of the melt 20 until the temperature of the seed crystal stabilizes. Following the initial thermal shock, the temperature of the entire seed crystal 10 quickly stabilizes to a temperature at or near the temperature of the surface of the melt so as to prevent any further dislocation generation. As illustrated in FIG. 3 and described in block 60 of FIG. 6a, once the temperature of the seed crystal 10 has stabilized as a result of primarily conductive heat transfer with the surface of the melt 20, the bottom end 10a of the seed crystal may be further lowered and inserted into the melt. The end 10a of the seed crystal is inserted into the melt such that the entire dip portion 10b of the seed crystal and all the dislocations contained therein are liquified into the melt 20, becoming part of the molten bath. As an example, and not for purposes of limitation, the dip portion of the seed crystal preferably ranges in length from about 1 mm to about 10 mm, although other lengths, greater or smaller, are considered to be well within the scope and spirit of the present invention. Once again, the seed crystal 10 is then held in position until the temperature of the seed crystal stabilizes.

Figure 4A:
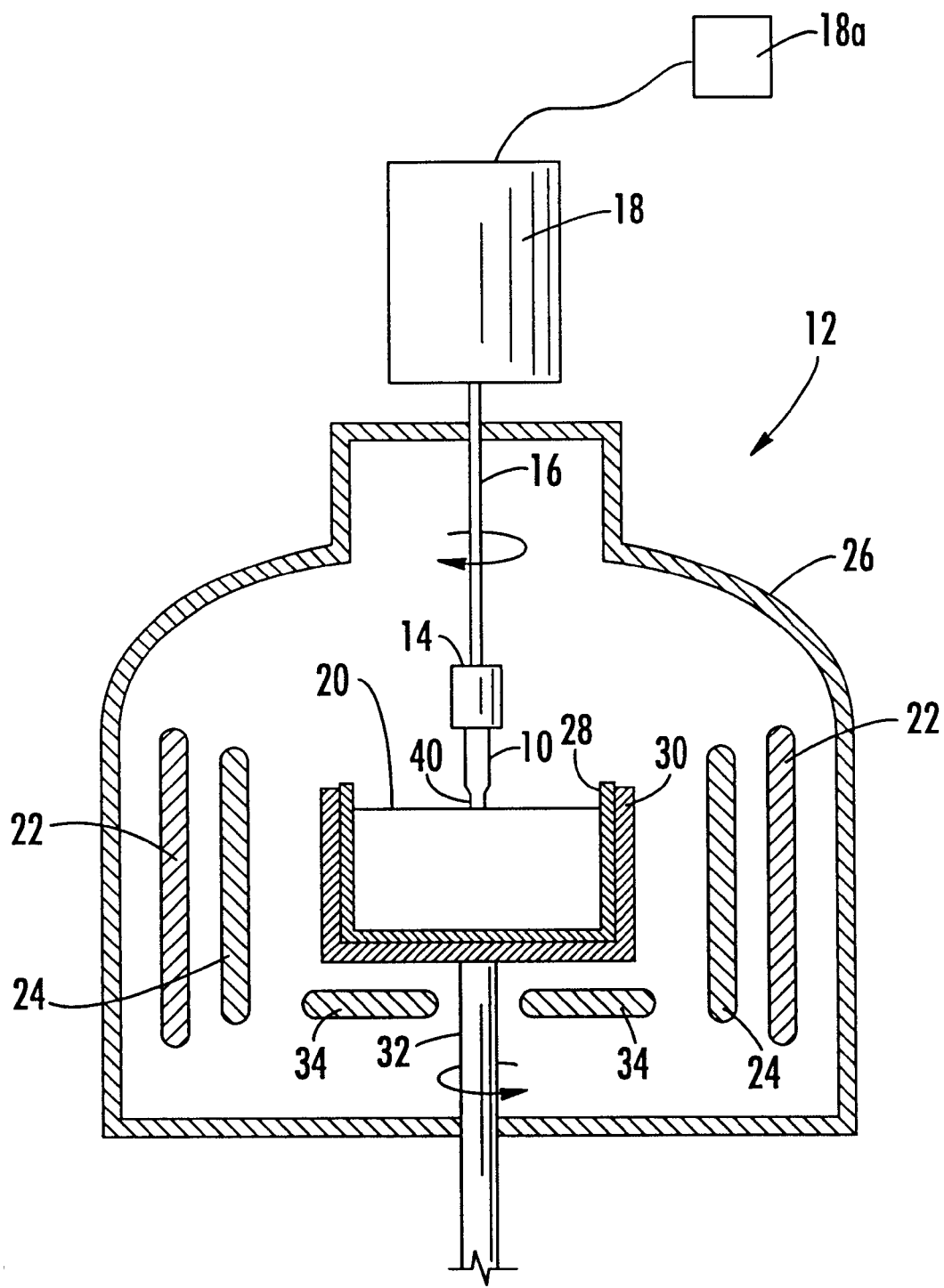
FIGS. 4a–4d are sequential schematic side views illustrating the withdrawal of the seed crystal from the melt to thereby grow a DF crystalline ingot having a <110> crystal direction, according to one embodiment of the present invention.
Figure 4B:
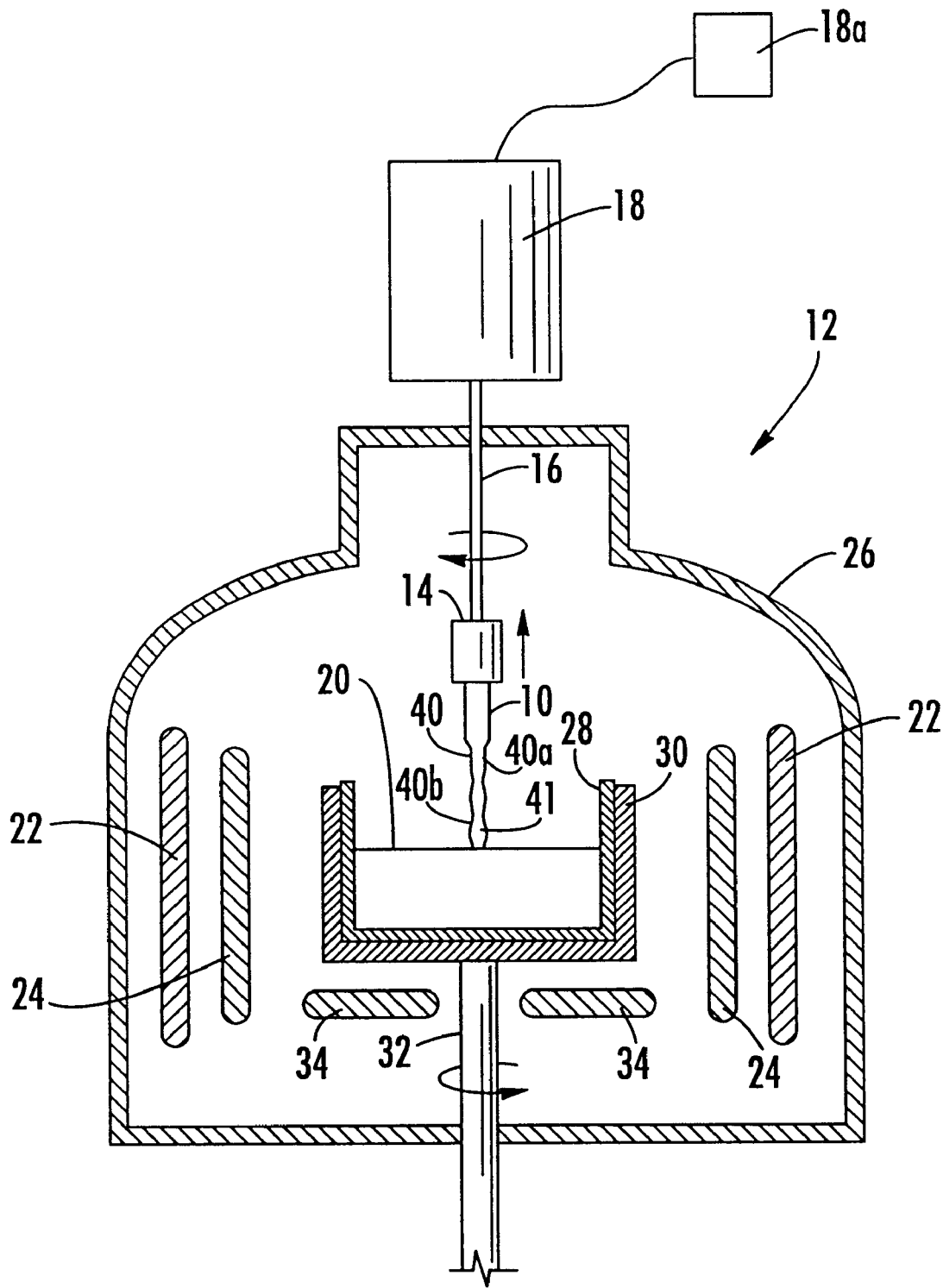

As illustrated in FIGS. 4a–4b and as described in block 62 of FIG. 6a, once the temperature of the seed crystal 10 has stabilized and the dip portion 10b of the seed crystal has melted, the seed crystal is gradually withdrawn from the melt 20 to grow a neck 40. The seed crystal 10 is withdrawn from the melt by gradually lifting the seed crystal from the surface of the melt using a lowering and raising mechanism 18, as is known to those skilled in the art. As the seed crystal 10 is withdrawn, however, the seed crystal remains in contact with the melt 20 during the formation of the neck 40. The melt 20 and the seed crystal 10 are generally rotated in opposite directions as the seed crystal is withdrawn from the melt to further improve the properties of the resulting crystal. For purposes of illustration and not limitation, the crucible 28 and seed crystal 10 are rotated in opposite directions at approximately 16 rotations per minute according to one embodiment. However, the seed crystal 10 and crucible 28 can be rotated at higher or lower speeds without departing from the spirit and scope of the present invention.

Figure 5:
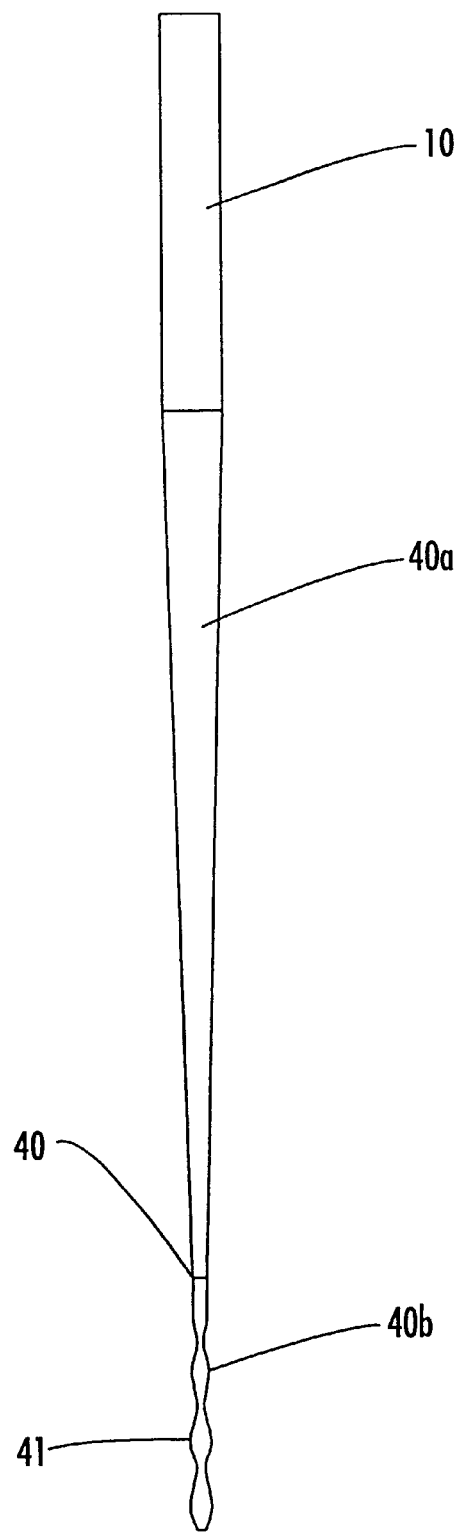
FIG. 5 is a side elevation view illustrating the neck formed by withdrawing the seed crystal from the melt as shown in FIGS. 4a–4b.
Figure 6B:
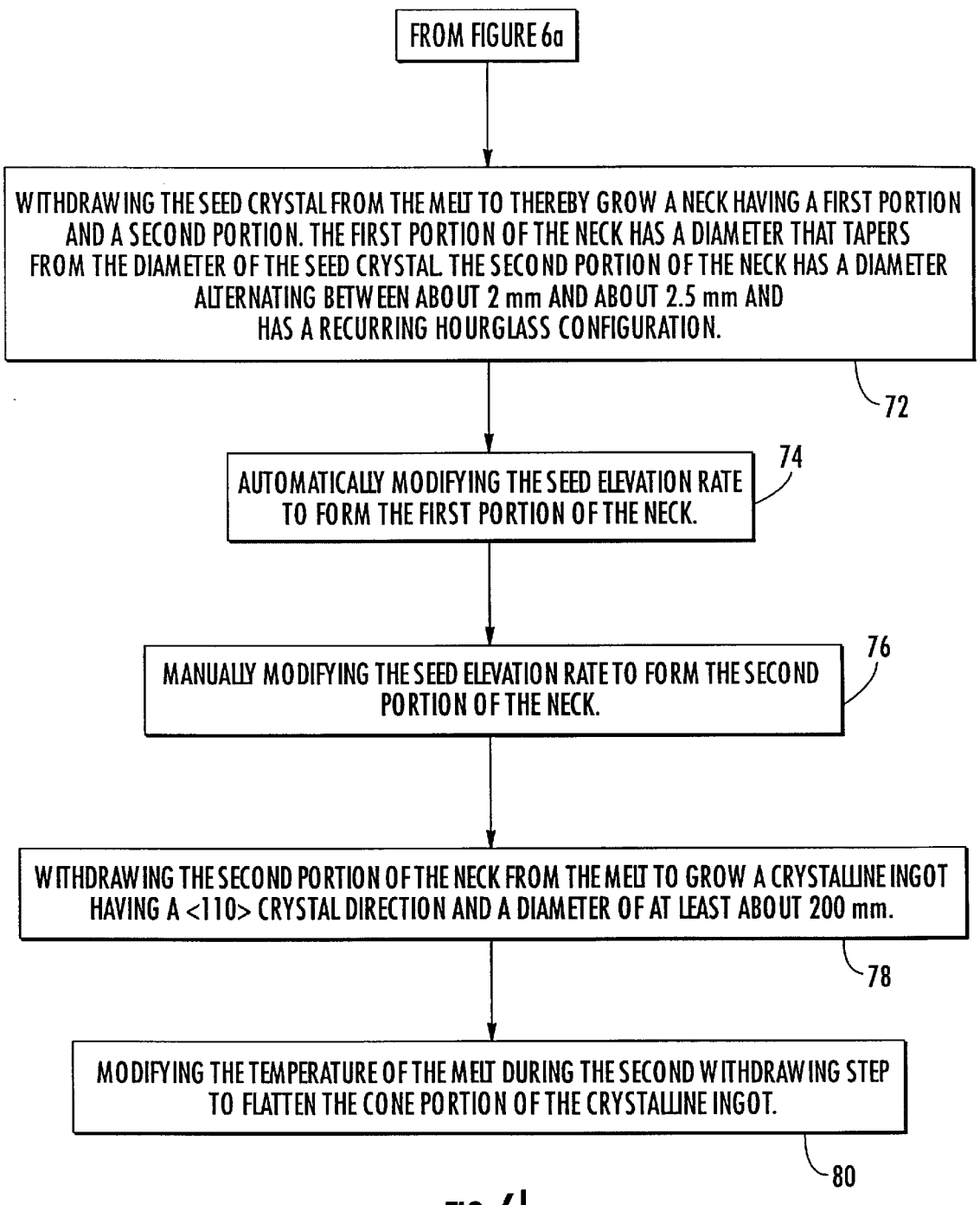

In one embodiment, as illustrated in FIGS. 4a and 5 and as described in block 72 of FIG. 6b, the neck 40 preferably defines first and second portions 40a, b. As described in block 74 of FIG. 6b, the first portion 40a of the neck 40 is formed by automatically modifying the seed elevation rate using the controlling means 18a and raising mechanism 18 to gradually reduce or taper the diameter of the neck from the diameter of the seed crystal 10. In this regard, the diameter of the neck 40 is proportional to the seed elevation rate such that an increase in the seed elevation rate reduces the diameter of the neck and a decrease in the seed elevation rate increases the diameter of the neck. For example, in one embodiment the seed elevation rate is automatically increased from about 4 to about 5 mm per minute over a period of about 45–55 minutes to thereby gradually taper the diameter of the neck 40 to an amount greater than about 2.5 mm over a length of approximately 22 cm, see block 64 of FIG. 6a and block 72 of FIG. 6b.

As illustrated in FIGS. 4b and 5 and as described in block 76 of FIG. 6b, the second portion 40b of the neck 40 is formed by manually modifying the seed elevation rate using the raising mechanism 18 to alternate the diameter of the neck between about 2 mm and about 2.5 mm to thereby form an hourglass configuration 41. As noted above, the diameter of the neck 40 is proportional to the seed elevation rate such that an increase in the seed elevation rate reduces the diameter of the neck and a decrease in the seed elevation rate increases the diameter of the neck. According to one embodiment, the seed elevation rate is alternated between approximately 0 mm per minute and 5 mm per minute to thereby form an hourglass configuration 41 over a length of about 2.5 cm to about 3.0 cm, see block 66 of FIG. 6a and block 76 of FIG. 6b. Advantageously, substantially all of the dislocations are terminated within the second portion 40b of the neck 40. While not intending to be limited or bound to any particular theory or explanation, it is believed that the combination of the hourglass configuration 41 and the reduction in diameter to between about 2 mm and about 2.5 mm effectively terminates dislocations within a neck 40 formed from a seed crystal having a <110> orientation.

Figure 4C:
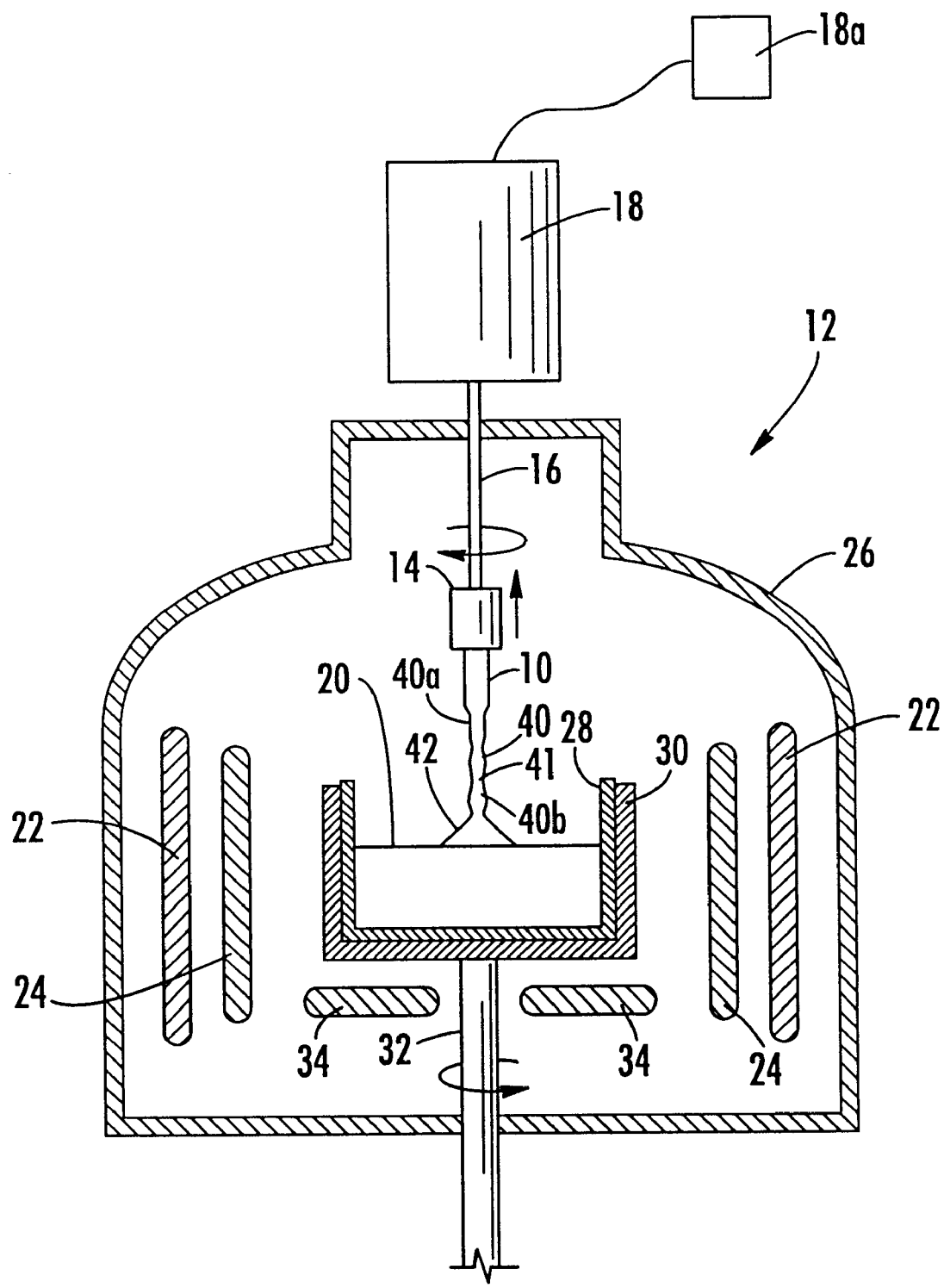
Figure 4D:
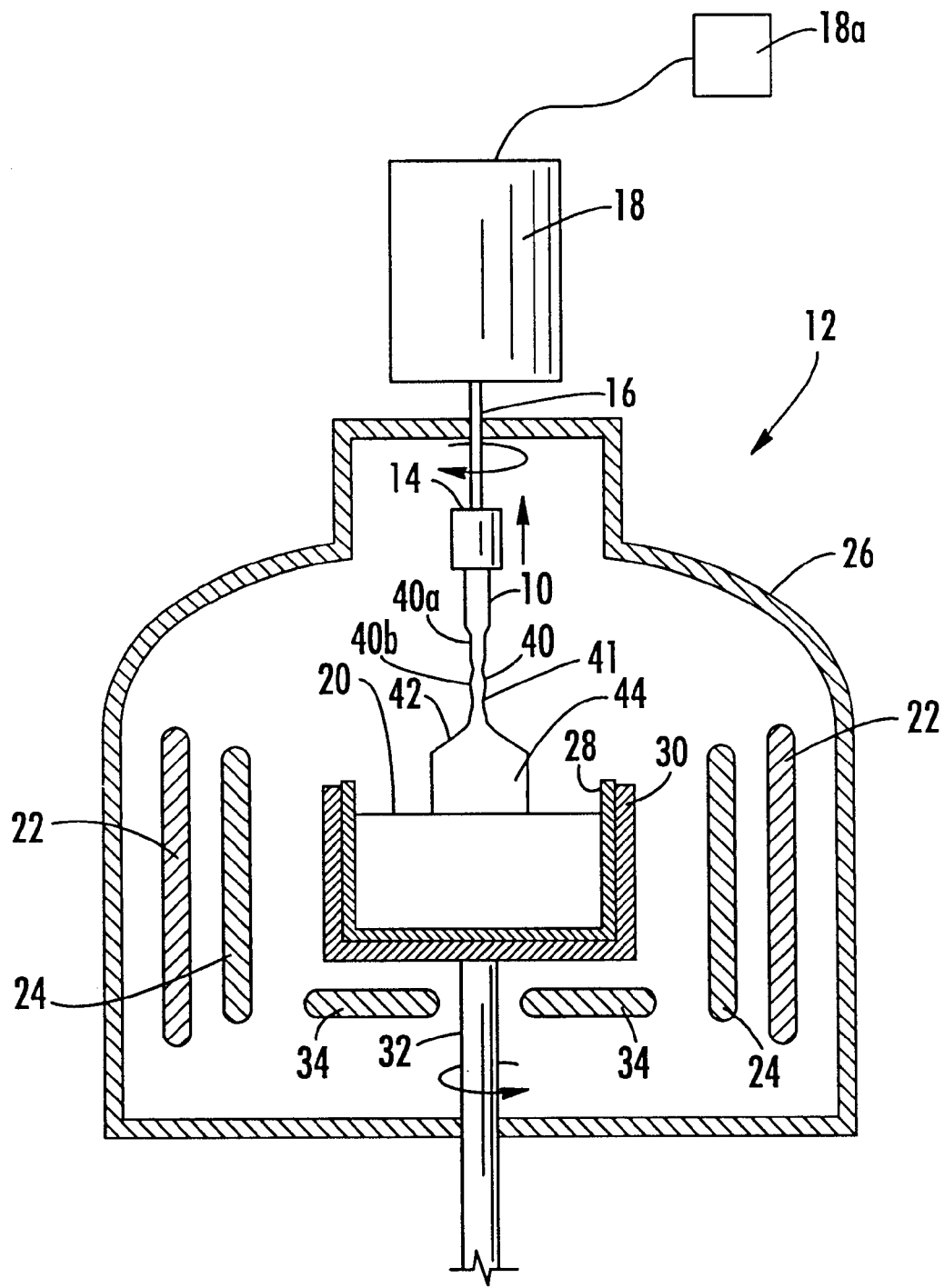

As illustrated in FIGS. 4c–4d and as described in blocks 68 and 78 of FIGS. 6a and 6b, respectively, once all of the dislocations are terminated within the neck 40, the second portion 40b of the neck is withdrawn from the melt 20 to grow a crystalline ingot according to conventional CZ crystal growing techniques. The second portion 40b of the neck 40 is withdrawn from the melt by gradually lifting the neck from the surface of the melt 20. As the second portion 40b of the neck 10 is withdrawn, however, the neck remains in contact with the melt 20 during the formation of the shoulder 42 and the main body 44 of the crystal. As is known to those skilled in the art, the melt 20 and the neck 40 are generally rotated in opposite directions as the neck is withdrawn from the melt to further improve the properties of the resulting crystal. In one embodiment, as described in blocks 70 and 80 of FIGS. 6a and 6b, respectively, the temperature of the melt 20 is modified when withdrawing the neck from the melt to flatten the cone portion 42 of the crystalline ingot to thereby quickly increase the diameter of the cone portion and the resulting crystalline ingot.

The present invention also provides a method of manufacturing DF crystalline ingots having a <110> crystal direction and a diameter of at least about 200 mm. As described in FIG. 6a, the method of growing the DF crystalline ingots includes providing a liquidous melt. See block 48. In one embodiment, a seed crystal having a <110> crystal direction and a length of about 100 mm to about 120 mm is provided. See block 50. In another embodiment, a seed crystal having a <110> crystal direction and a width of about 15 mm is provided. See block 52. Next, the seed crystal is contacted with the surface of the melt. See block 56. In one embodiment, the seed crystal is positioned near the melt prior to the contacting step to thereby raise the temperature of the seed crystal and, thus, decrease the temperature gradient between the seed crystal and the melt. See block 54. In another embodiment, the seed crystal is held in contact with the melt after the contacting step until the temperature of the seed crystal stabilizes. See block 58. In still another embodiment, a portion of the seed crystal is inserted into the melt after the contacting step such that the inserted portion of the seed crystal melts. See block 60. For example, in one embodiment, a portion of the seed crystal about 1 mm to about 10 mm in length is inserted into the melt.

As illustrated in FIG. 6a, the seed crystal is then withdrawn from the melt to thereby grow a neck. See block 62. In one embodiment, the seed elevation rate is automatically modified during the withdrawing step to reduce the diameter of the neck to greater than about 2.5 mm. See block 64. Thereafter, the seed elevation rate is manually modified to alternate the diameter of the neck between about 2 mm and about 2.5 mm to thereby shape the neck into a recurring hourglass configuration. See block 66. Advantageously, the portion of the neck having the recurring hourglass configuration facilitates termination of dislocations within the neck such that the crystalline ingot grown using the neck is substantially dislocation free. Thereafter, the neck is withdrawn from the melt to grow a crystalline ingot having a <110> crystal direction and a diameter of at least about 200 mm. See block 68. The crystalline ingot preferably includes a cone portion, a main body, and an elongate tapered tail. In one embodiment, the temperature of the melt is modified during the second withdrawing step, i.e., when withdrawing the neck from the melt to grow a crystalline ingot, to flatten the cone portion of the crystalline ingot. See block 70.

In another embodiment of the present invention, as illustrated in FIG. 6b, the seed crystal is withdrawn from the melt to thereby grow a neck having a first portion and a second portion. See block 72. The first portion of the neck has a diameter that tapers from the diameter of the seed crystal. The second portion of the neck has a diameter alternating between about 2 mm and about 2.5 mm and has a recurring hourglass configuration. Advantageously, substantially all dislocations are terminated within the second portion of the neck. In one embodiment, the seed elevation rate is automatically modified during the withdrawing step to form the first portion of the neck. See block 74. Thereafter, the seed elevation rate is manually modified to form the second portion of the neck. See block 76. The second portion of the neck is then withdrawn from the melt to grow a crystalline ingot having a <110> crystal direction and a diameter of at least about 200 mm. See block 78. As discussed above, the crystalline ingot preferably includes a shoulder or cone portion, a main body, and an elongate tapered tail. In one embodiment, the temperature of the melt is modified during the second withdrawing step, i.e., when withdrawing the neck from the melt to grow a crystalline ingot, to flatten the shoulder of the crystalline ingot. See block 80.

Accordingly, there has been provided an improved technique for growing large-diameter DF crystalline ingots having a <110> crystal direction. Advantageously, the technique allows DF crystalline ingots having a <110> crystal direction and a diameter of at least about 200 mm to be grown. Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An article of manufacture, comprising:
   a monocrystalline ingot formed of silicon, said crystalline ingot having a <110> crystal direction and a diameter of at least about 200 mm.

2. An article according to claim 1 wherein said crystalline ingot is doped with a material selected from a group consisting of phosphorous, arsenic, antimony, boron, aluminum, gallium, and indium.

3. An article according to claim 1 wherein said crystalline ingot comprises a body portion and a neck extending therefrom, at least a portion of said neck adjacent to said body portion having a recurring hourglass configuration.

4. An article according to claim 3 wherein said portion of said neck having a recurring hourglass configuration has a diameter alternating between about 2 mm and about 2.5 mm.

5. An article of manufacture, comprising:
   a monocrystalline ingot formed of silicon, said crystalline ingot being substantially dislocation free and having a <110> crystal direction and a diameter of at least about 200 mm.

6. An article according to claim 5 wherein said crystalline ingot is doped with a material selected from a group consisting of phosphorous, arsenic, antimony, boron, aluminum, gallium, and indium.

7. An article according to claim 5 wherein said crystalline ingot comprises a body portion and a neck extending therefrom, at least a portion of said neck adjacent to said body portion having a recurring hourglass configuration.

8. An article according to claim 7 wherein said portion of said neck having a recurring hourglass configuration has a diameter alternating between about 2 mm and about 2.5 mm.

9. A crystalline ingot manufactured by a process comprising the steps of:
   providing a liquidous melt;
   contacting a seed crystal having a <110> crystal direction with the surface of the melt;
   withdrawing the seed crystal from the melt to thereby grow a neck; and
   withdrawing the neck from the melt to grow a crystalline ingot having a <110> crystal direction and a diameter of at least about 200 mm.

10. A process according to claim 9, further comprising:
    automatically modifying the seed elevation rate during said first withdrawing step to reduce the diameter of the neck to greater than about 2.5 mm; and
    thereafter, manually modifying the seed elevation rate to alternate the diameter of the neck between about 2 mm and about 2.5 mm to thereby shape the neck into a recurring hourglass configuration.

11. A process according to claim 9 wherein the crystalline ingot comprises a cone portion, main body, and tail, and further comprising reducing the temperature of the melt during said second withdrawing step to flatten the cone portion of the crystalline ingot.

12. A process according to claim 9 further comprising positioning the seed crystal near the melt to thereby raise the temperature of the seed crystal prior to said contacting step.

13. A process according to claim 9 further comprising holding the seed crystal in contact with the melt after said contacting step until the temperature of the seed crystal stabilizes.

14. A process according to claim 9 further comprising inserting a portion of the seed crystal into the melt after said contacting step such that the inserted portion of the seed crystal melts.

15. A process according to claim 14 wherein said inserting step comprises inserting a portion of the seed crystal about 1 mm to 10 mm in length.

16. A process according to claim 9 further comprising providing a seed crystal about 100 mm to about 120 mm in length prior to said contacting step.

17. A process according to claim 9 further comprising providing a seed crystal having a width of about 15 mm prior to said contacting step.

18. A process according to claim 9 wherein said first withdrawing step comprises withdrawing the seed crystal from the melt to thereby grow a neck having a first portion and a second portion, the first portion of the neck having a tapered diameter, the second portion of the neck having a diameter alternating between about 2 mm and about 2.5 mm and having a recurring hourglass configuration.

* * * * *